United States Patent

Nayak et al.

Patent Number: 5,951,917
Date of Patent: *Sep. 14, 1999

[54] CONDUCTIVE PASTE FOR LARGE GREENSHEET SCREENING INCLUDING HIGH THIXOTROPIC AGENT CONTENT

[75] Inventors: Jawahar P. Nayak, Wappingers Falls; Michael E. Cropp, LaGrangeville; John M. Wargo, Poughkeepsie; Nancy A. Wier-Cavalieri, Highland; Charles W. Hunter, Jr., New Windsor, all of N.Y.

[73] Assignee: International Business Machines Corporation, Armonk, N.Y.

[*] Notice: This patent is subject to a terminal disclaimer.

[21] Appl. No.: 09/035,948

[22] Filed: Mar. 6, 1998

Related U.S. Application Data

[63] Continuation of application No. 08/829,809, Mar. 27, 1997, Pat. No. 5,783,113.

[51] Int. Cl.⁶ .............................. H01B 1/20; H01B 1/22
[52] U.S. Cl. ............................................ 252/512; 252/500
[58] Field of Search .................................... 252/500, 512, 252/510, 511

[56] References Cited

U.S. PATENT DOCUMENTS

| | | | |
|---|---|---|---|
| 3,830,651 | 8/1974 | Minneman et al. | 252/514 |
| 4,464,420 | 8/1984 | Taguchi et al. | 427/96 |
| 4,493,789 | 1/1985 | Ueyama et al. | 252/514 |
| 4,822,645 | 4/1989 | Oda et al. | 427/376.3 |
| 5,096,619 | 3/1992 | Slack | 252/514 |
| 5,114,642 | 5/1992 | Jung | 264/61 |
| 5,152,931 | 10/1992 | Alexander | 252/512 |
| 5,164,246 | 11/1992 | Tanaka et al. | 428/209 |
| 5,236,630 | 8/1993 | Arima et al. | 252/512 |
| 5,503,777 | 4/1996 | Itagaki et al. | 252/518 |

*Primary Examiner*—Mark Kopec
*Attorney, Agent, or Firm*—Whitham, Curtis & Whitham; Tiffany Townsend

[57] ABSTRACT

Deformation of vias and shorting between vias during screening of conductive paste onto greensheets wider than 185 mm is avoided by a concentration of thixotropic agent in the conductive paste formulation to a concentration which raises the thixotropic index of the paste to within 5% to 25% of the maximum achievable thixotropic index for the organic vehicle in the paste. For a paste containing molybdenum powder in which the organic vehicle is a mixture of ethyl cellulose, texanol and oleoyl sarcosine, this criterion corresponds to a concentration of glycerl tri(-12-hydroxystearate) in the range of 1.4% to 1.8% by weight.

6 Claims, 1 Drawing Sheet

CONDUCTIVE PASTE FOR LARGE GREENSHEET SCREENING INCLUDING HIGH THIXOTROPIC AGENT CONTENT

CROSS REFERENCE TO RELATED APPLICATION

This application is a continuation of application Ser. No. 08/829,809 filed Mar. 27, 1997, now U.S. Pat. No. 5,783,113, issued Jul. 21, 1998.

BACKGROUND OF THE INVENTION

1. Field of the Invention

The present invention generally relates to the manufacture of multi-layer ceramic (MLC) circuit packages and, more particularly, to screening conductive patterns and via filling at small via spacing on wide greensheets.

2. Description of the Prior Art

It has been recognized for some years that miniaturization of electronic circuits produces both manufacturing economies and performance enhancement of the circuits. Small spacing between connected electronic elements results in reduced signal propagation time between circuit elements as well as allowing increased numbers of electronic elements to be placed on a single chip and formed on a single wafer of particular dimensions with a particular series of process steps. Thus the cost of the process can be spread over an increased number of chips of increased performance as well as potentially increased functionality.

Some limits on integration density and circuit miniaturization are imposed by process incompatibility and conflicts for different types of circuit elements. For example, while hybrid BiCMOS devices are known and have been successfully fabricated and used for some purposes, bipolar and CMOS processes are largely incompatible. Similarly, processes for making large capacity dynamic random access memories including potentially millions of small capacitors on or in the substrate are very different from the processes used to form and interconnect transistors in logic arrays. While such conflicts could be approached through masking during chip formation, process complexity is multiplied and manufacturing yield is compromised.

Accordingly, extremely complex electronic circuits have been formed at very small size using multi-layer modular (MLM) packages and multi-layer ceramic (MLC) packages in particular. These packages are formed by forming conductive patterns on insulating lamina with conductive materials filling holes therein to form vias. While polyimide is often used for MLM packages, an uncured ceramic material referred to as a greensheet is used for MLC packages. (A greensheet is of a "rubbery" consistency in its uncured state when screening takes place.) The lamina are then stacked and laminated together to form a robust structure with a complex circuit embedded therein for interconnection of a potentially large plurality of chips which may be formed by independent and potentially incompatible processes. Connections between conductive patterns on respective lamina and to mounting pads for the integrated circuits and connection pins and the like on surfaces of the module are made by the conductive material filling the vias.

It should be understood that the same economic and performance incentives toward higher integration density on a chip, often in combination with somewhat increased chip area, also apply to such modular circuit packages. Therefore, modular circuit packages with increased area and decreased size of vias and spacing between vias have been attempted.

At the present state of the art, good manufacturing yields have been achieved with 185 mm wide greensheets having a via spacing of 9 mils, via diameters of 4 mils and greensheet thicknesses of 6 mils. However, acceptable manufacturing yields have not been achieved with a 215 mm wide power plane greensheet having a larger 5.5 mil via diameter for 8 and 11 mil thickness greensheets and a via pitch of 10 mils or less. (The larger diameter vias provided to increase current-carrying capability thus exceed one-half of the via pitch. Note also that the increased lamina thickness either maintains or increases via aspect ratio.) Power planes form a significant portion of MLC packages, particularly where different voltages must be supplied to a plurality of chips in the MLM or MLC package which may be formed by different technologies and require different operating and signal voltages.

On the larger greensheets, the screening paste which is used to fill vias tends to distort the greensheet at the bottom of the vias at pressures sufficient to achieve via filling, producing oversize vias. Oversize vias violate spacing rules and may even become shorted together. The reason for these distortions is not precisely known since it is presently impossible to observe the mechanics and relative motion of the greensheet and paste (between a backing sheet and a mask below a nozzle through which the paste is extruded) during screening but, while not wishing to be held to any particular theory, is probably due, at least in part; to a combination of factors including the greater elastic strain which may occur in a larger greensheet for a given amount of force applied thereto (thus inferring that some aspects of the present processing of 185 mm greensheets have relatively small process tolerances).

Reduction in screening pressure or variation of other screening process parameters to avoid such distortions has uniformly resulted in insufficient via filling for reliable connections to be made between lamina or failure to rectify the problem of oversize and/or shorted vias. As a result, virtually 100% of the wider greensheets included at least one instance of insufficient via fill, spacing violations or shorting between vias and no combination of variation of process parameters and/or known paste formulation was capable of significantly reducing the incidence of such malformations, much less produce an economically acceptable manufacturing yield.

Thixotropic additives are known in formulations of screening pastes for MLC package manufacture. For example, numerous thixotropic additives are disclosed and discussed in U.S. Pat. No. 5,503,777, hereby fully incorporated by reference. Essentially, a suitable paste will contain a conductive powder (and possibly non-conductive fillers) and an organic vehicle including an organic binder. While this paste will exhibit some thixotropy (e.g. the "thixotropic index" is the negative of the slope of the curve of viscosity as a function of shear rate), such a material will maintain a relatively constant viscosity with shearing forces applied thereto and the resulting shear rate.

A thixotropic agent is generally a metal organic ("organometallic") compound which, when added to the above paste at a low concentration, reacts with the organic vehicle. The reaction enhances a property known as thixotropy such that viscosity decreases significantly with increasing shear rate and vice-versa to increase the thixotropic index of the paste. That is, if no force is applied thereto, a thixotropic paste tends to behave as a solid but the material flows increasingly in the manner of a liquid as increased force is applied. Viscosity will often decrease below that of a non-thixotropic paste (e.g. a paste without a thixotropic agent even though it may exhibit some degree of thixotropy) at high shear rates.

Thus, the above-incorporated U.S. patent employs a low concentration (0.5% of the paste while the organic vehicle is generally between or less than 15%–20% of the paste by weight which achieves a three-fold increase in thixotropic index) of thixotropic agent sufficient to prevent flow of paste (referred to therein as "leveling") as the solvent is removed after screening by further processing or absorption by the green sheet while leaving the screening process substantially unaffected. Leveling otherwise produces a dimple in the top of the via due to reduction of paste volume. The above-incorporated U.S. patent also reports a marked reduction in thixotropic index (e.g. reduction in effectiveness of the thixotropic agent to increase the thixotropic index and/or causing a decrease the thixotropic index) as the amount of thixotropic agent is increased (as generally depicted in FIG. 5) from 1.0% to 2.0% for tetrabenzyl orthosilicate and from 2.0% to 4.0% for silicon 2-ethyl-hexanoate (merely doubling the thixotropic index at 0.5% at a 2.0% concentration).

Therefore it has been conventional to maintain the concentration of thixotropic additives very low in order to decrease or avoid increase in effective viscosity during screening so as to properly fill narrow or high aspect ratio vias and properly form fine conductive patterns on the greensheets while presenting a viscosity sufficient to resist internal stresses during further processing after the screening process is completed when no further flow of paste is intended. Nevertheless, no known paste formulation either with or without thixotropic agents has been suitable for achieving even marginally acceptable manufacturing yields on 215 mm or larger power plane greensheets.

SUMMARY OF THE INVENTION

It is therefore an object of the present invention to provide a method for increasing manufacturing yield in MLC circuit packages and power plane greensheets larger than 185 mm suitable for use in modular circuit packages.

It is another object of the invention to provide a conductive paste formulation for screening which does not result in via distortion of MLM or MLC lamina or shorting between vias therein during screening.

In order to accomplish these and other objects of the invention, a conductive paste is provided including a conductive powder, an organic vehicle including an organic binder, and a thixotropic agent at a concentration which raises the thixotropic index of the paste to within 5%–25% of the maximum achievable thixotropic index for the paste, generally corresponding to a concentration in the range of 1.4%–1.8% by weight of the paste.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
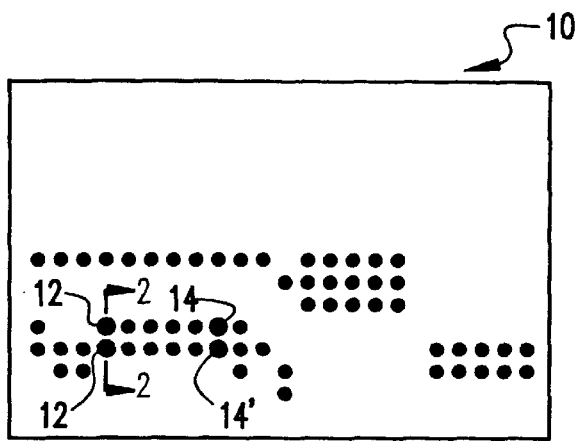
FIG. 1 is a plan view of a portion of a greensheet including deformed and shorted vias as produced with prior paste formulations.
Figure 2:
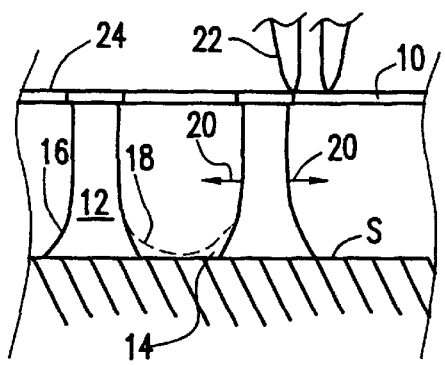
FIG. 2 is a cross-section of a portion of FIG. 1 including two adjacent vias.
Figure 3:
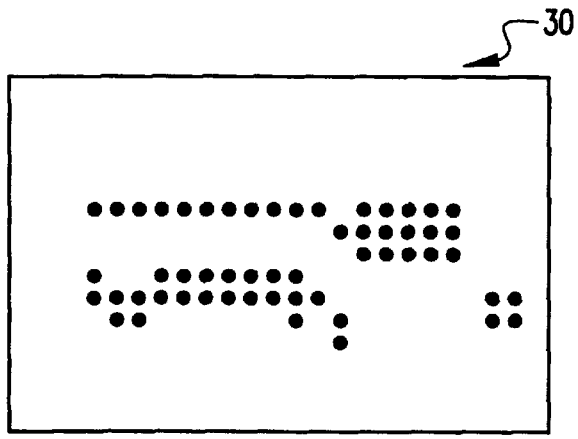
FIG. 3 is a plan view of a greensheet after screening with a paste in accordance with the invention.
Figure 4:
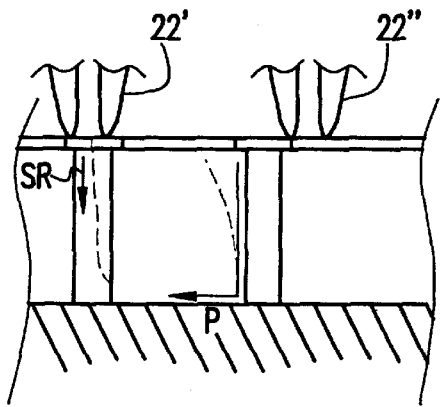
FIG. 4 is a cross-section of a portion of the greensheet of FIG. 3 showing two adjacent vias, and FIG. 5 graphically depicts the general behavior of changes in thixotropy with concentration of thixotropic agent for an arbitrary paste and thixotropic agent combination.
Figure 5:
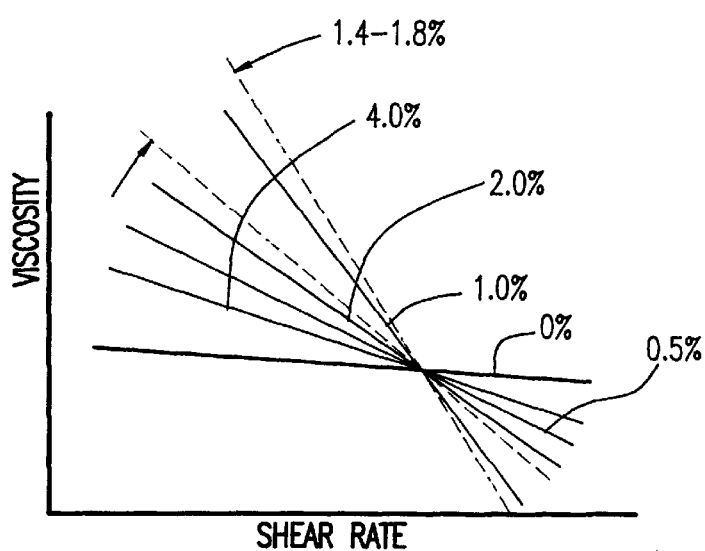

Referring now to the drawings, and more particularly to FIGS. 1 and 2, there is shown in magnified plan view and in further enlarged cross-section, respectively, a portion of the bottom of a 215 mm greensheet 10 after screening with a conductive paste in accordance with prior methodologies and paste formulations. It is to be understood, however, that no portion of FIG. 1 or FIG. 2 is admitted to be prior art as to the present invention but, rather, is presented in the interest of conveying a clear understanding of the meritorious effects of the present invention, as illustrated in FIGS. 3 and 4 as compared to methods and materials over which the present invention constitutes an improvement.

As can be seen from FIGS. 1 and 2, while the majority of vias are properly formed, vias 12 are formed oversize (O/S) and vias 14, 14' are formed shorted together. It may be noted that while the via diameter, as illustrated, is less than one-half the via pitch rather than exceeding one-half the via pitch in a power plane greensheet, as alluded to above, the via distortion and via shorting is still observed. The shorting of vias 14, 14' clearly represents a defect in the via-filled greensheet. Oversize vias 12 may or may not cause a defect when the lamina is stacked with other lamina but are clearly a violation of spacing design rules and are therefore likely to cause a defect.

If a defect is, in fact, caused upon lamination with other lamina, it is impossible to correct without the ability to form proper connections elsewhere by a so-called engineering change (EC) which is costly in terms of time to carry out the EC as well as the design and fabrication of redundant structures within the MLM or MLC in order to enable later use thereof for such ECs and the space consumed on the MLM or MLC by the redundant structures. The only other potential solution would be to increase spacing between vias which carries the same expense of lamina space and limits the degree of miniaturization potentially achievable.

As seen in FIG. 2, taken along section 2—2 of FIG. 1, upon filling, the perimeter of the vias 12 appears to be pressed outwardly, as indicated at 16, against the resilient greensheet 10 by the pressure of the paste during the screening process. While the mechanism causing such via distortion is not known, as alluded to above, the increased lateral dimensions of the greensheet together with sequential or unequal filling of adjacent vias at any given point in time during the via filling process may cause localized lateral elastic strain in the greensheet as indicated by arrows 20 which may result in a localized wiping action of the greensheet against the screening support S as screening nozzle 22 traverses the screening mask 24 and green sheet 10. If present, this effect would aggravate the spreading of paste at the bottom of the vias and increase enlargement of the vias at the bottom of the greensheet 10. In a severe case, screening paste may then become trapped between the greensheet 10 and the screening support S as shown by dashed line 18, resulting in shorting 14 of vias.

Referring now to FIGS. 3 and 4, it has been found by the inventors that increasing the concentration of thixotropic agent to between 1.4% to 1.8% by weight and preferably about 1.6% by weight, allows reliable via filling without distortion of the bottoms of the vias of the greensheet even with increased lateral greensheet dimensions. This concentration of thixotropic agent is much greater than would normally be used to prevent post-screening movement of paste, as disclosed in the above-incorporated U.S. patent and, while the thixotropic index of the paste formulation is not presently known, is believed to be within about 5%–25% of the maximum thixotropic index obtainable for the paste. This range of concentration of the paste formulation allowed a manufacturing yield of filled greensheets in excess of 95% defect-free in comparison with a near zero percent defect-free yield with any other formulation or screening process modification or variation.

For comparison, a 1.0% concentration, by weight, of thixotropic agent in the paste produced good manufacturing yield during screening and via filling of 185 mm wide but was completely unsuccessful in screening and filling the wider 215 mm greensheets without producing via distortion and/or shorting between vias. While determination of thixotropic index is somewhat uncertain (being a "best fit" of a line through empirically determined values of viscosity and shear rate; both such measurements being subject to substantial uncertainty and error), the 1.6% thixotropic agent formulation appears to represent only a 5% increase in thixotropic index over that of the 1.0% thixotropic agent formulation (although the thixotropic index of the 1.0% thixotropic agent formulation is already relatively high). When it is observed that the difference in width between the 185 mm and 215 mm greensheets is only about 10% while diminishing the manufacturing yield to zero and that a manufacturing yield in excess of 95 % can be developed only by the increase in thixotropic index to within 5% to 25% of maximum for a given paste (even when it represents only a seemingly slight increase over a completely unsuccessful formulation), it is seen that the invention is highly counter-intuitive and provides a solution to a problem having a previously unrecognized and severe criticality.

The invention is preferably practiced using a moly paste comprising molybdenum powder, and an organic vehicle including ethyl cellulose, TEXANOL (an ester alcohol), and oleoyl sarcosine with a 1.6% concentration by weight of a commercially available thixotropic agent known in the art as thixcin (CAS registry number 9001-78-3) which is also known as hydrogenated castor oil or castor wax. The chemical name for the material is glyceryl tri(12)-hydroxystearate. The preferred material is commercially available under the name of "THIXCIN R" which is a trademark of NL Industries, Inc. However, the principles of the invention are applicable to any other thixotropic agent which to reacts predictably with any particular known screening paste formulation to increase thixotropic index, such as those alluded to above disclosed in the above-incorporated U.S. patent, as will be apparent to those skilled in the art in view of this disclosure. The meritorious effects of the invention will be produced as long as the viscosity of the thixotropic paste formulation can reach viscosities equal to or less than the viscosity of the paste without the thixotropic agent at practical screening pressures and shear rates resulting therefrom and which otherwise allow filling of the vias in green sheets.

The addition of a thixotropic agent to a screening paste at greater than normal concentration (e.g. to suppress undesired paste movement during post-screening processing) is effective to provide extremely high manufacturing yield and nearly complete avoidance of via distortion and shorting during filling of greensheets having lateral dimensions of 215 mm or greater where defect-free screening could not previously be accomplished. It is possible, in this regard, that the effects of the invention may be enhanced by increased shear rate (SR of FIG. 4) due to high via aspect ratio or diminished diameter of vias and may allow a reduction in via spacing or pitch or even increased paste pressures for filling fine vias. As shown by the dashed line graphically representing the projected paste pressure P of FIG. 4 within a via as via filling is completed, the thixotropic viscosity of the paste in accordance with the invention is believed to cause a pressure drop or gradient over the via height due to increasing levels of viscous drag as paste movement and shear rate becomes vanishingly small as the paste motion ceases within the vias.

In view of the foregoing, it is clearly seen that the invention provides a large and unexpected improvement in manufacturing yield of filled greensheets of dimensions in excess of 185 mm by utilization of a counter-intuitive screening paste formulation having an increased concentration of a thixotropic agent several times greater than in known formulations. The screening paste formulation with a high concentration of a thixotropic agent in accordance with the invention avoids virtually all via distortion during screening which may be significant to manufacturing yield while providing reliable and consistent via filling without modification of any other screening process parameters or additional process steps.

While the invention has been described in terms of a single preferred embodiment, those skilled in the art will recognize that the invention can be practiced with modification within the spirit and scope of the appended claims.

Having thus described my invention, what we claim as new and desire to secure by Letters Patent is as follows:

1. A conductive paste, comprising:

a conductive powder, an organic vehicle comprising an organic binder, and a thixotropic agent comprising hydrogenated castor oil, said hydrogenated castor oil contained at a concentration effective to provide a viscosity in said conductive paste that is equal to or less than the viscosity of said conductive paste where devoid of said thixotropic agent, and at screening pressures allowing filling of vias in a 215 mm wide green sheet having 5.5 mil via diameter, a via pitch less than 10 mils and a thickness of 8 to 11 mils.

2. A conductive paste as recited in claim 1, wherein said conductive powder is a molybdenum powder.

3. A conductive paste as recited in claim 1, wherein said organic vehicle is a mixture comprised of ethyl cellulose, ester alcohol and oleoyl sacosine.

4. A conductive paste as recited in claim 3, wherein said thixotropic agent is glyceryl tri(12)-hydroxystearate.

5. A conductive paste, comprising:

a conductive powder, an organic vehicle comprising an organic binder, and a thixotropic agent comprising hydrogenated castor oil, said hydrogenated castor oil contained at a concentration in said paste ranging from 1.4 to 1.8% by weight, effective to provide a viscosity in said conductive paste that is equal to or less than the viscosity of said conductive paste where devoid of said thixotropic agent, and at screening pressures allowing filling of vias in a 215 mm wide green sheet having 5.5 mil via diameter, a via pitch less than 10 mils and a thickness of 8 to 11 mils.

6. A conductive paste, comprising:

a conductive powder, an organic vehicle comprising an organic binder, and a thixotropic agent comprising hydrogenated castor oil, said hydrogenated castor oil contained at a concentration in said paste is 1.6% by weight, effective to provide a viscosity in said conductive paste that is equal to or less than the viscosity of said conductive paste where devoid of said thixotropic agent, and at screening pressures allowing filling of vias in a 215 mm wide green sheet having 5.5 mil via diameter, a via pitch less than 10 mils and a thickness of 8 to 11 mils.

* * * * *